United States Patent
Chiang et al.

(10) Patent No.: US 7,457,133 B2
(45) Date of Patent: Nov. 25, 2008

(54) ELECTRONIC APPARATUS WITH NATURAL CONVECTION STRUCTURE

(75) Inventors: Lien-Jin Chiang, Taoyuan Hsien (TW); Chun-Chen Chen, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 207 days.

(21) Appl. No.: 10/676,115

(22) Filed: Oct. 2, 2003

(65) Prior Publication Data

US 2004/0201973 A1     Oct. 14, 2004

(30) Foreign Application Priority Data

Apr. 11, 2003   (TW) ............................... 92108471 A

(51) Int. Cl.
*H05K 7/14*   (2006.01)
*H05K 7/18*   (2006.01)

(52) U.S. Cl. .................... 361/797; 361/800; 361/790

(58) Field of Classification Search ............... 361/800, 361/797, 752, 756, 724, 714, 796, 816, 687–688, 361/692, 694, 790, 683–686, 667–668; 165/80.3; 174/16.1, 17, 16.2, 19, 15.6, 522, 524, 526
See application file for complete search history.

(56) References Cited

U.S. PATENT DOCUMENTS

| | | | | |
|---|---|---|---|---|
| 4,399,484 A | * | 8/1983 | Mayer .......................... | 361/689 |
| 4,953,058 A | * | 8/1990 | Harris .......................... | 361/690 |
| 5,063,475 A | * | 11/1991 | Balan .......................... | 361/687 |
| 5,089,935 A | * | 2/1992 | Ito .............................. | 361/692 |
| 5,218,516 A | * | 6/1993 | Collins et al. ............... | 361/721 |
| 5,321,585 A | * | 6/1994 | Trittschuh et al. ........... | 361/784 |
| 5,521,792 A | * | 5/1996 | Pleitz et al. ................. | 361/715 |
| 5,586,004 A | * | 12/1996 | Green et al. ................ | 361/699 |
| 5,844,777 A | * | 12/1998 | Gates .......................... | 361/700 |
| 6,094,346 A | * | 7/2000 | Schweers et al. ........... | 361/695 |
| 6,201,705 B1 | * | 3/2001 | Nygren et al. .............. | 361/753 |
| 6,459,578 B1 | * | 10/2002 | Wagner ....................... | 361/694 |
| 6,580,608 B1 | * | 6/2003 | Searls et al. ................ | 361/690 |
| 6,927,980 B2 | * | 8/2005 | Fukuda et al. .............. | 361/700 |
| 7,099,153 B2 | * | 8/2006 | Yazawa ....................... | 361/692 |
| 7,180,737 B2 | * | 2/2007 | Straub et al. ................ | 361/690 |
| 7,265,973 B2 | * | 9/2007 | Lanni .......................... | 361/695 |

* cited by examiner

*Primary Examiner*—Hung S Bui
(74) *Attorney, Agent, or Firm*—Bacon & Thomas, PLLC

(57) ABSTRACT

An electronic apparatus with natural convection structure is disclosed. The electronic apparatus with natural convection structure includes a main body to be placed on a surface, a hole piercing through the main body from a top surface to a bottom surface of the main body, and a supporting device disposed on the bottom surface of the main body. Via the specific height of the supporting device, the air under and near the bottom surface of the main body can flow through the hole for improving heat-dissipation of the electronic apparatus.

19 Claims, 6 Drawing Sheets

ELECTRONIC APPARATUS WITH NATURAL CONVECTION STRUCTURE

FIELD OF THE INVENTION

This invention relates to an electronic apparatus, and more particularly to an electronic apparatus with natural convection structure.

BACKGROUND OF THE INVENTION

The adapter and the power supply are electronic apparatuses used frequently in our daily life. Taking the adapter as an example, it is generally employed for rectifying and converting the external AC power into the DC power, so as to supply the required power to an electric appliance, such as a notebook, or charge the charging battery.

Please refer to FIG. 1, which shows the casing of the conventional adapter. The casing of the conventional adapter 1 includes an upper casing 11 and a lower casing 12, in which the upper casing 11 and the lower casing 12 can be engaged with each other, and a space is provided between the upper casing 11 and the lower casing 12 for receiving a printed circuit board 13. When the upper casing 11 and the lower casing 12 are engaged with each other, a first opening and a second opening are formed on the opposite surfaces of the assembled casing for fixing a socket 14 and a power cord 15 therein, respectively. The socket 14 and the power cord 15 can be electrically connected with the printed circuit board 13, respectively. Thereby, the external power can be provided to the printed circuit board 13 through the socket 14, and the power converted by the printed circuit board 13 can be provided to the electric appliance for usage through the power cord 15.

With the integration of the integrated circuit, the volume of the electronic apparatus is also decreased, which results in the difficulty of heat-dissipation. A large amount of heat is usually generated from the electronic elements on the printed circuit board during the operation of the adapter. However, the upper and lower casings of the conventional adapter are made of plastic, and it is obvious that the heat is hard to dissipate and would accumulate in the interior of the adapter since the plastic has low heat-conductance coefficient. If the heat accumulated within the adapter cannot be dissipated efficiently, the electronic elements in the adapter will be damaged easily, and thus, not only the lifespan but also the power converting efficiency of the adapter will be decreased significantly.

For overcoming the problem of heat-dissipation, an adapter 1 as shown in FIG. 2 is provided in the market, which has plural heat-dissipating holes 20 formed on the upper and lower casings 11, 12. However, via the design of the heat-dissipating holes 20, the heat generated in the adapter 1 can only be dissipated by convection due to the temperature difference between the interior and the exterior of the adapter 1, and the heat-dissipating performance thereof is not good enough. In addition, another type of adapter (not shown) is also provided in the market, which has a small heat-dissipating fan and wind exits for driving out the heat accumulated in the interior of the adapter. However, such design limits the miniaturization of the adapter, and the heat generated in the adapter cannot be evenly dissipated by the heat-dissipating fan, so that the temperature of the adapter cannot be equalized, and thus the heat accumulating in the dead space for heat-dissipation may cause damages to the neighboring electronic elements.

Furthermore, for the user of the portable notebook, since the adapter becomes hot after it is used for a period of time, the user may be scalded when touching the adapter. Therefore, to overcome the disadvantages of the prior art described above, it is needed to provide a heat-dissipating casing of an electronic apparatus which has effects of heat-dissipation, temperature-equalization and scald-prevention.

SUMMARY OF THE INVENTION

It is an object of the present invention to provide an electronic apparatus with natural convection structure which can improve the heat-dissipating effect of the electronic apparatus, and equalize the temperature of the interior and exterior of the electronic apparatus.

In accordance with an aspect of the present invention, the electronic apparatus with natural convection structure includes a main body to be placed on a surface, an airflow channel piercing through the main body from a top surface to a bottom surface thereof, and a supporting device disposed on the bottom surface of the main body.

The electronic apparatus further includes at least a printed circuit board disposed in the main body and having an opening, wherein the centroids of the opening and the airflow channel are positioned at the same axis vertical to the top surface and the bottom surface.

Preferably, the electronic apparatus has plural airflow channels, and the printed circuit board has plural openings as well.

Preferably, the supporting device has a specific height varying with the size of the electronic apparatus, and the specific height is at least 3 mm.

Preferably, the electronic apparatus is a power adapter or a power supply.

Preferably, the distances from the airflow channel to the edges of the main body are substantially equal.

Preferably, the airflow channel has an opening at one side of the main body.

Preferably, the main body and the airflow channel are integrally formed.

Preferably, the bottom surface of the main body has a curve structure.

In accordance with another aspect of the present invention, the electronic apparatus with natural convection structure includes a main body to be placed on a surface, in which the main body having a top surface and a bottom surface, and the bottom surface having a curve structure, and airflow channel piercing through the main body from the top surface to the bottom surface.

The electronic apparatus further includes at least a printed circuit board disposed in the main body and having an opening, wherein the centroids of the opening and the airflow channel are positioned at the same axis vertical to the top surface and the bottom surface.

Preferably, the electronic apparatus has plural airflow channels, and the printed circuit board has plural openings as well.

Preferably, the curve structure has a specific height varying with the size of the electronic apparatus, and the specific height is at least 3 mm.

Preferably, the electronic apparatus is a power adapter or a power supply.

Preferably, the distances from the airflow channel to the edges of the main body are substantially equal.

Preferably, the airflow channel has an opening at one side of the main body.

Preferably, the main body and the airflow channel are integrally formed.

Preferably, the electronic apparatus further includes at least one supporting device disposed on the bottom surface of the main body.

In accordance with an additional aspect of the present invention, the electronic apparatus with natural convection structure includes a main body to be placed on a surface, in which the main body having a top surface and a bottom surface, and the bottom surface having a curve structure, an airflow channel piercing through the main body from the top surface to the bottom surface, and a supporting device disposed on the bottom surface of the main body.

Preferably, the curve structure combined with the supporting device has a specific height varying with the size of the electronic apparatus, and the specific height is at least 3 mm.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

The present invention relates to an electronic apparatus with natural convection structure. The present techniques are illustrated with the following embodiments for an adapter, but the electronic apparatus which is applicable to the present techniques is not limited to the adapter. Any electronic apparatus which is applicable to the following techniques, such as a power supply, a charger and a transformer, is incorporated herein for reference.

The adapter of the present invention mainly includes a heat-dissipating casing, a circuit board, an input device and an output device. In a preferred embodiment of the present invention, the input device can be a plug, a socket or a power cord, and the output device can also be a plug, a socket or a power cord, in which the output device is determined according to what the input device is. For the convenience of description, the following embodiments are illustrated with an adapter having a socket as the input device and a power cord as the output device, in which the socket can be connected to a plug of a power cord for inputting the commercially available power, and the adapter can output the converted power to an information equipment, such as a notebook, via the output device of the power cord.

Figure 1:
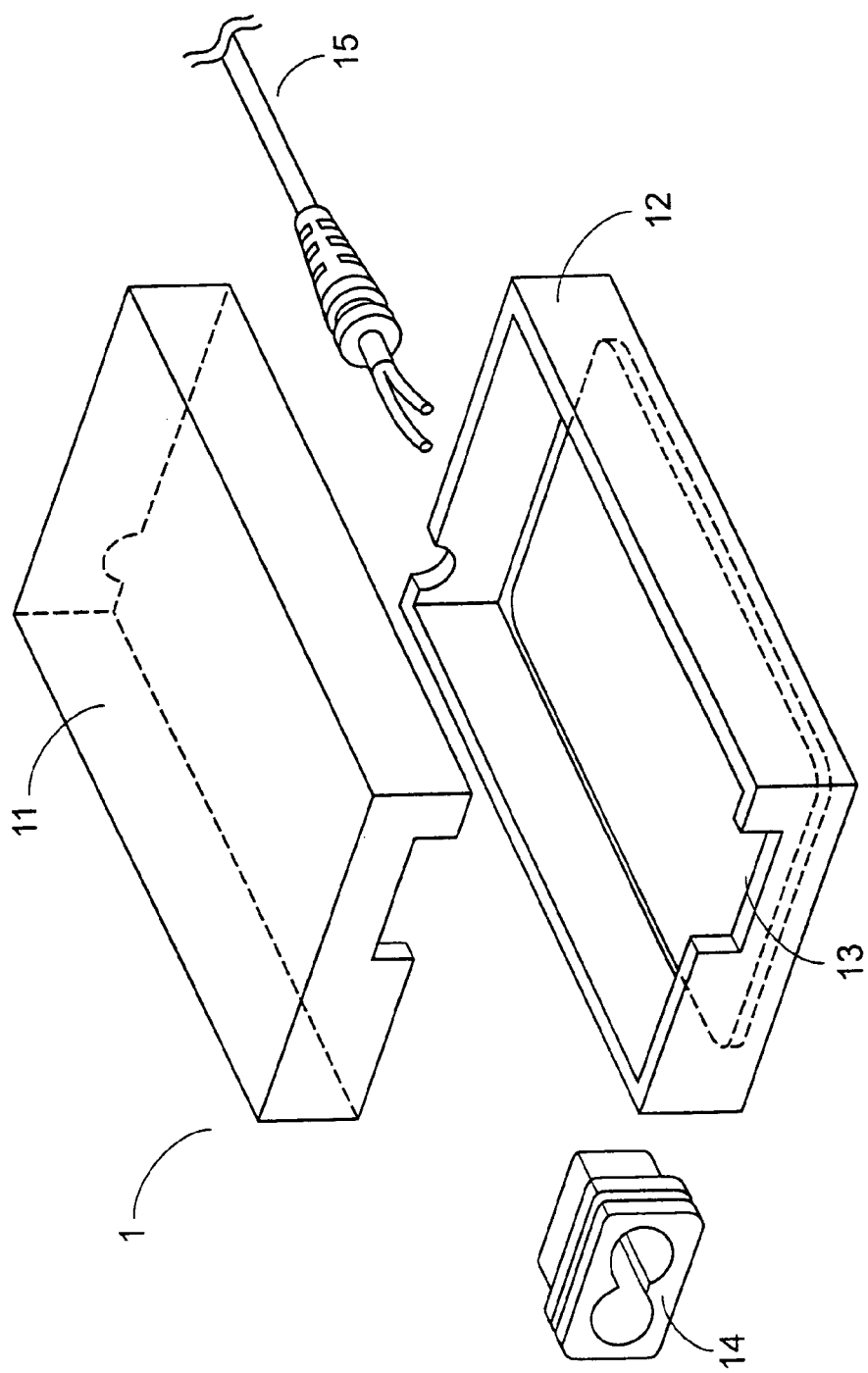
FIG. 1 is a schematic view showing the casing of the conventional adapter.
Figure 2:
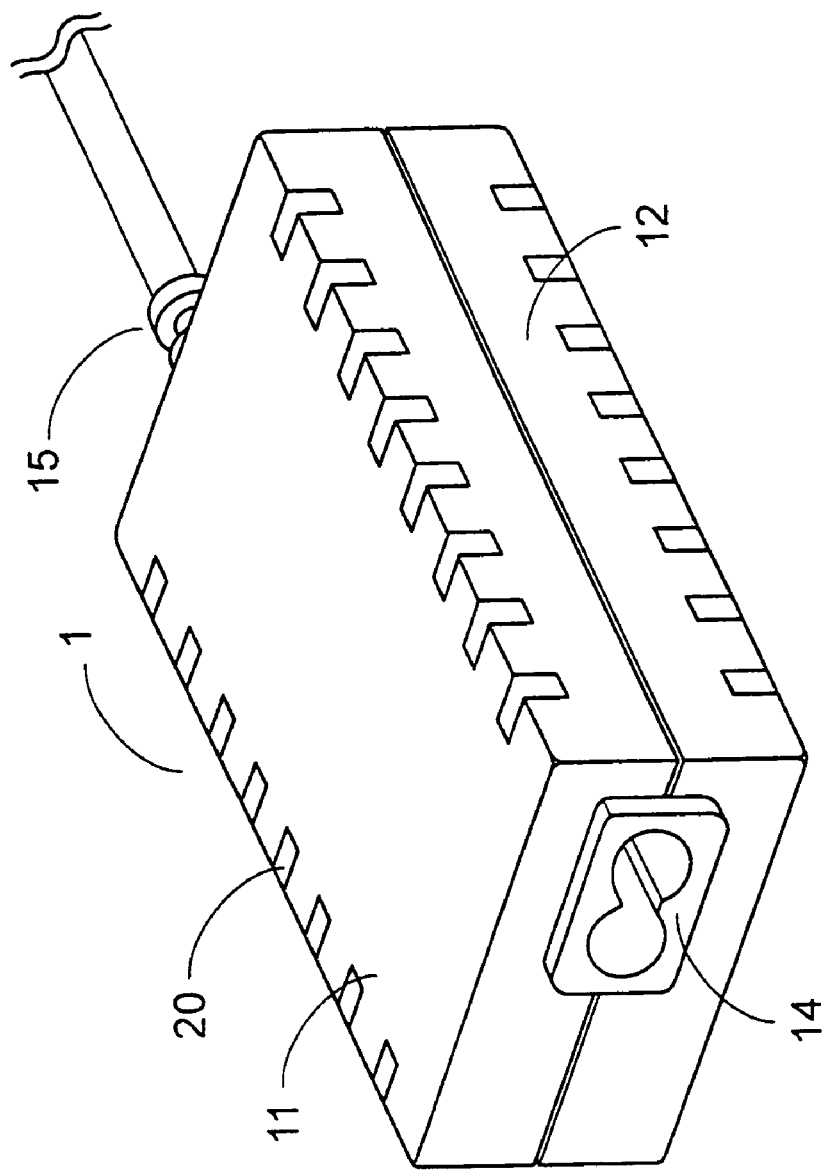
FIG. 2 is a schematic view showing the heat-dissipating casing of the conventional adapter which has heat-dissipating holes.
Figure 3:
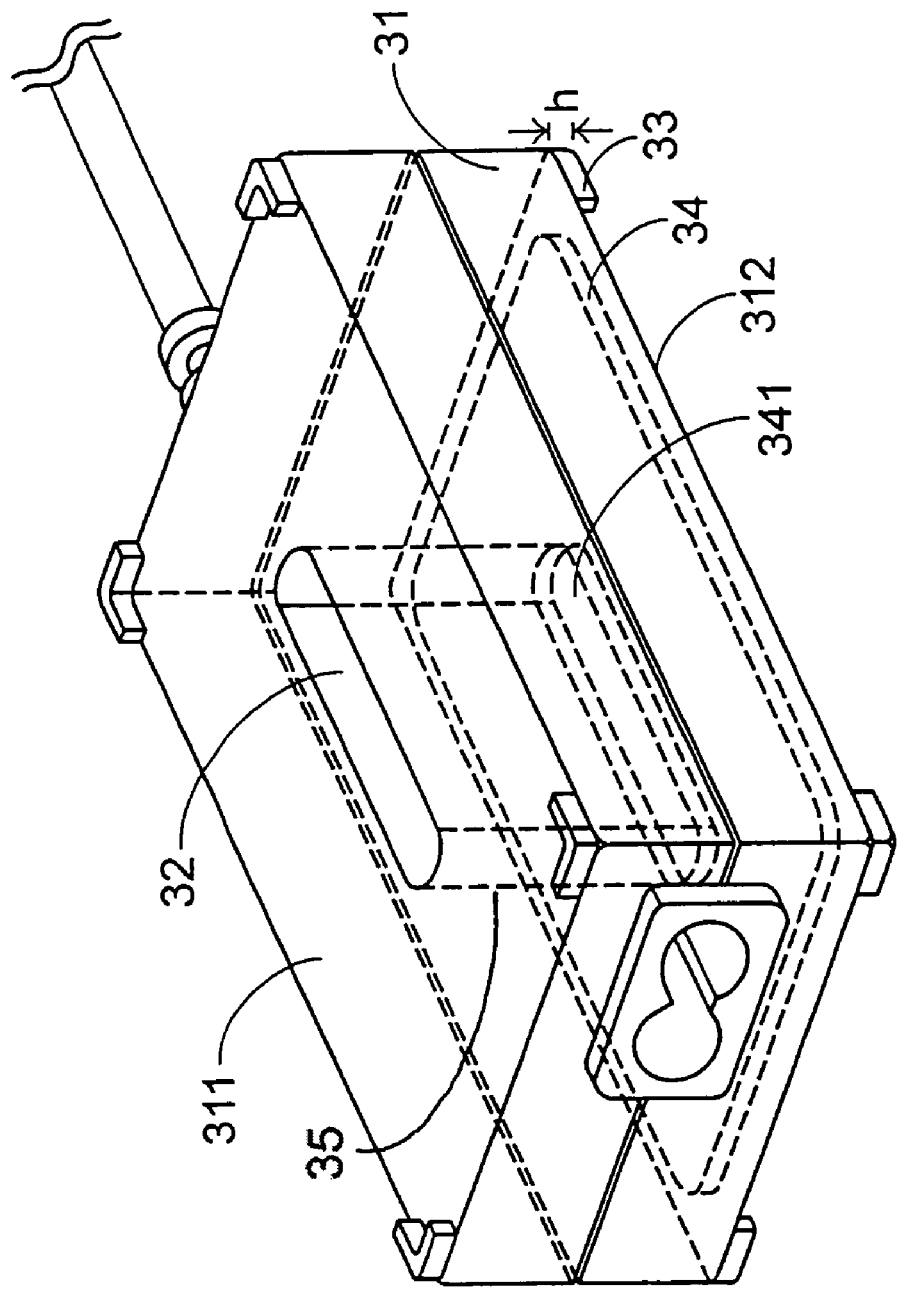
FIG. 3 is a schematic view showing the electronic apparatus with natural convection structure according to a first preferred embodiment of the present invention.

Please refer to FIG. 3 which is a schematic view showing the electronic apparatus with natural convection structure according to a first embodiment of the present invention. As shown in FIG. 3, the electronic apparatus at least includes a main body 31, an airflow channel 32 and a supporting device 33, wherein the airflow channel 32 is formed by an inner wall 35 that extends from the top surface 311 to the bottom surface 312 of the main body 31. The main body 31 can be placed on a surface and has a printed circuit board 34 disposed therein. The printed circuit board 34 has an opening 341, in which the centroids of the opening 341 and the airflow channel 32 are positioned at the same axis that is vertical to a top surface 311 and a bottom surface 312 of the main body 31, so that the airflow channel 32 can pierce through the main body 31 from the top surface 311 to the bottom surface 312. In addition, the supporting device 33 is disposed on the bottom surface 312 of the main body 31, and has a specific height h which varies with the size of the electronic apparatus and is at least 3 mm so as to provide a natural air convection structure and increase the heat-dissipating area of the electronic apparatus.

Figure 4:
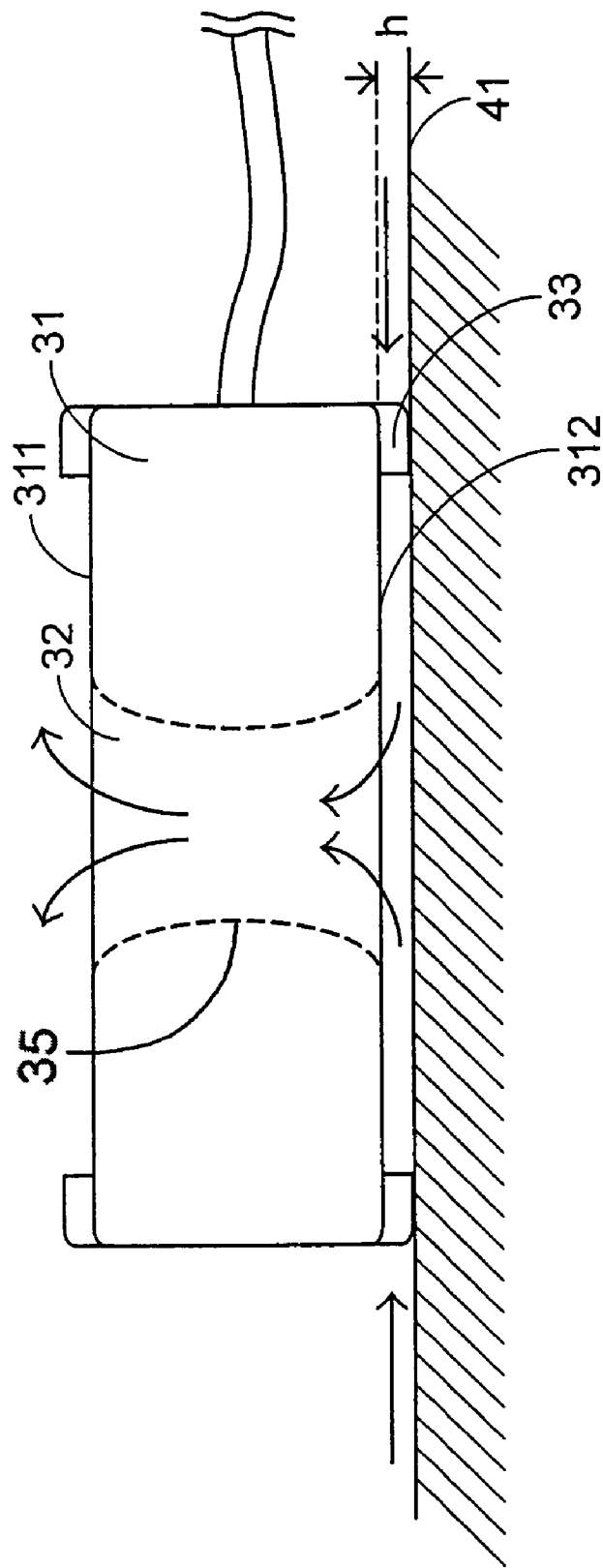
FIG. 4 is a side view of FIG. 3.

Please refer to FIG. 4 which is a side view of FIG. 3. As shown in FIG. 4, the electronic apparatus is usually placed on a surface 41 such as a surface of a table or desk. When the electronic apparatus is being used, the temperature of the electronic elements on the interior printed circuit board gradually increases, and the heat generated from the electronic elements can be transferred to the surface of the electronic apparatus by conduction or radiation. In the meantime, the air near the bottom surface 312 of the electronic apparatus is heated and the temperature thereof increases due to the increasing temperature of the bottom surface 312. Since the supporting device 33 has a specific height h, there is a specific distance between the main body 31 and the surface 41. While the temperature of the air near the bottom of the main body 31 increases, the density thereof decreases; as a result, the air near the bottom of the main body 31 has a tendency to flow up, and can flow up though the airflow channel 32. Then the cool air surrounding the bottom of the main body 31 will fill the space left by the up-flowing warm air, thereby forming a cyclic airflow, which provides a better heat convection effect. By the cyclic airflow, the heat of the surface of the electronic apparatus is easily to be dissipated and the temperature thereof decreases. Therefore, the electronic apparatus of the present invention has a better heat-dissipating effect. Moreover, the airflow channel 32 is a piercing structure, which results in the increase of the surface area of the electronic apparatus as well as the total heat-dissipating area, so that the heat-dissipating effect of the electronic apparatus can be reinforced.

Figure 5:
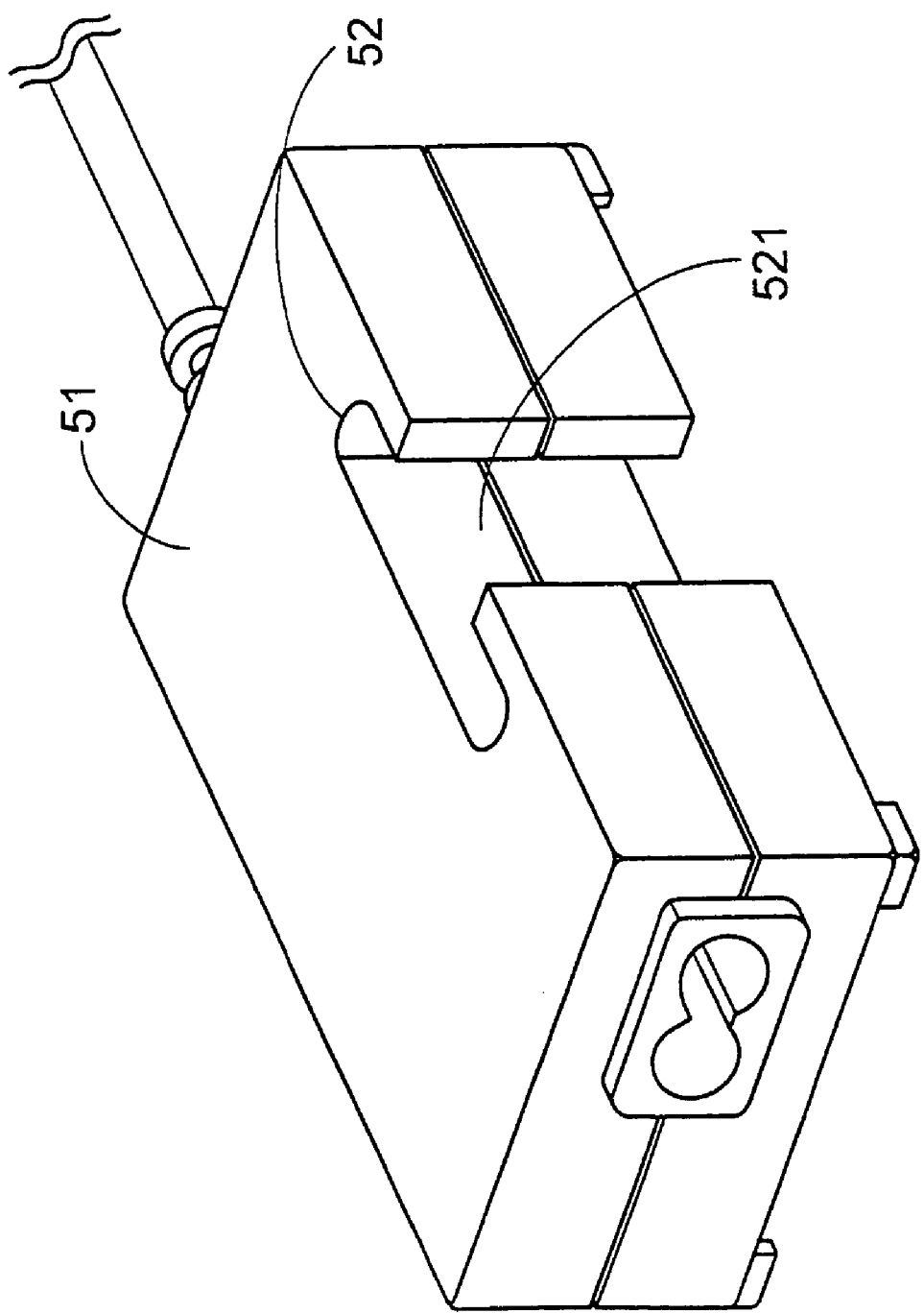
FIG. 5 is a schematic view showing the electronic apparatus with natural convection structure according to a second preferred embodiment of the present invention.

Certainly, the number, size and shape of the airflow channel of the electronic apparatus in the present invention are not limited. For example, the number of the airflow channel should be matched up with the wiring arrangement of the interior printed circuit board, and if possible, having more airflow channels is better for heat-dissipation. In addition, the location of the airflow channel is not limited either. Usually, for improving the heat-dissipating effect, a preferred location of the airflow channel is at the center of the main body of the electronic apparatus, so that the distances from the airflow channel to the edges of the main body are substantially equal and thus the heat-dissipation of the electronic apparatus is more even. Alternatively, the location near the major heat-generating source of the printed circuit board is another preferred location of the airflow channel. The airflow channel can be located at one side of the main body, or further include an opening. Please refer to FIG. 5 which is a schematic view showing the electronic apparatus with natural convection structure according to a second preferred embodiment of the present invention. The airflow channel 52 is located at one side of the main body 51, and a sidewall of the airflow channel 52 further includes an opening 521. Therefore, when the electronic apparatus is used by a user, it can be hanged on a matching element via the airflow channel 52 and the opening 521 so as to fix the electronic apparatus.

Figure 6:
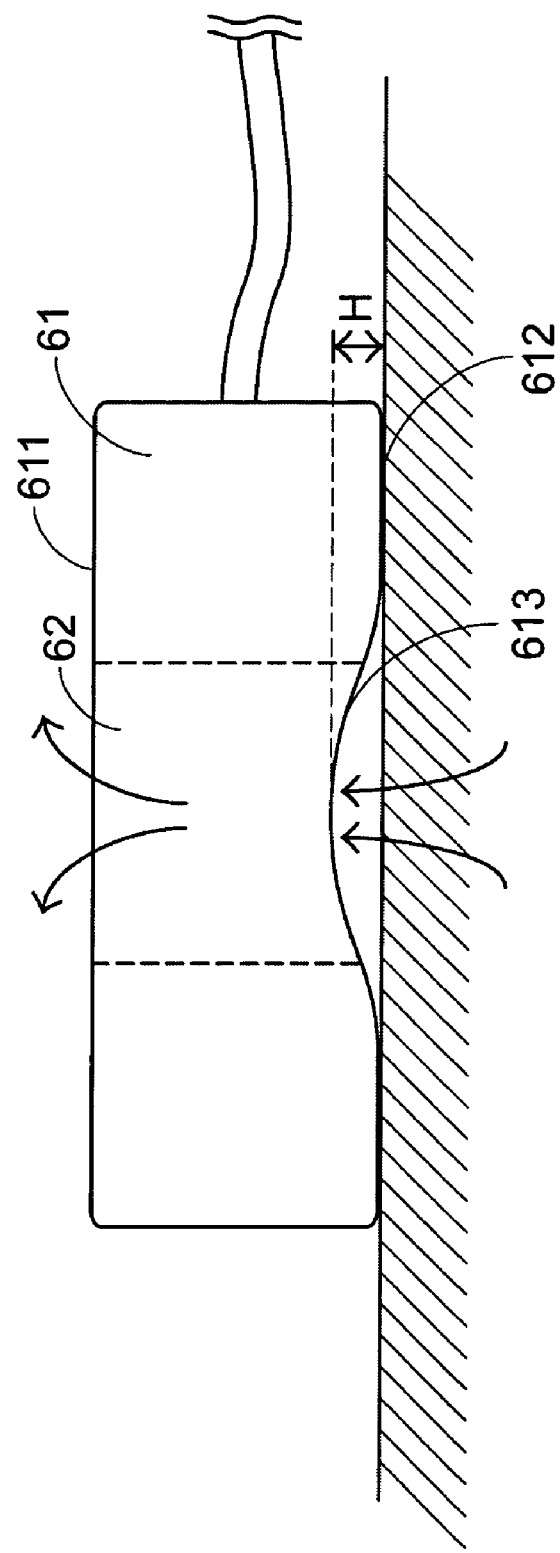
FIG. 6 is a schematic view showing the electronic apparatus with natural convection structure according to a third preferred embodiment of the present invention.

Please refer to FIG. 6 which is a schematic view showing the electronic apparatus with natural convection structure according to a third preferred embodiment of the present invention. As shown in FIG. 6, the electronic apparatus at least includes a main body 61 and an airflow channel 62. The bottom surface 612 of the main body 61 has a curve structure 613, which has a specific height H, and the airflow channel 62 pierces through the main body 61 from the top surface 611 to the bottom surface 612. When the temperature of the electronic apparatus increases, the curve structure 613 of the bottom surface 612 of the main body 61 can form a good airflow channel, and the warm air will flow along the curve structure 613 and pass through the airflow channel 62 50 as to form a cyclic airflow. Therefore, the heat of the surface of the electronic apparatus is easily to be dissipated. Also, the airflow channel 62 can increase the surface area of the electronic apparatus as well as the total heat-dissipating area, and further improve the heat-dissipating effect of the electronic apparatus.

In conclusion, the electronic apparatus of the present invention has a airflow channel which pierces through the main body, and there is a specific height at the bottom of the electronic apparatus, so the warm air at the bottom of the electronic apparatus can flow up along the airflow channel and the surrounding cool air will fill the space. Therefore, a cyclic airflow is formed, which provides a better heat convection effect. In addition, the airflow channel can increase the surface area of the electronic apparatus as well as the total heat-dissipating area. As a result, the present invention overcomes the disadvantage of poor heat-dissipation of the prior art, and improve the heat-dissipating effect of the electronic apparatus. Moreover, with respect to manufacturing, the airflow channel and the main body of the electronic apparatus are integrally formed, so the manufacturing cost and time will not increase. Thus, the present invention possesses high industrial value.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An electronic apparatus with natural convection structure, comprising:
   a main body to be placed on a surface, said main body having an airflow channel piercing through said main body from a top surface to a bottom surface thereof, wherein said airflow channel is formed by an inner wall extending from an exterior of said top surface to an opposite exterior of said bottom surface;
   at least a printed circuit board disposed in said main body, said printed circuit board having an opening, and centroids of said opening and said airflow channel being positioned at a same axis substantially vertical to said top surface and said bottom surface; and
   a supporting device disposed on said bottom surface of said main body.

2. The electronic apparatus according to claim 1 wherein said electronic apparatus has plural said airflow channels, and said printed circuit board has plural said openings correspondingly.

3. The electronic apparatus according to claim 1 wherein said supporting device has a specific height varying with the size of said electronic apparatus, and said specific height is at least 3 mm.

4. The electronic apparatus according to claim 1 wherein said electronic apparatus is a power adapter or a power supply.

5. The electronic apparatus according to claim 1 wherein the distances from said airflow channel to the edges of said main body are substantially equal.

6. The electronic apparatus according to claim 1 wherein said airflow channel has an opening at one side of said main body.

7. The electronic apparatus according to claim 1 wherein said main body and said airflow channel are integrally formed.

8. The electronic apparatus according to claim 1 wherein said bottom surface of said main body has a curve structure.

9. An electronic apparatus with natural convection structure, comprising:
   a main body to be placed on a surface, said main body having a top surface and a bottom surface and having an airflow channel formed by an inner wall extending from an exterior of said top surface to an opposite exterior of said bottom surface, wherein said bottom surface has a curve structure; and
   at least a printed circuit board disposed in said main body, said printed circuit board having an opening, and centroids of said opening and said airflow channel being positioned at a same axis substantially vertical to said top surface and said bottom surface.

10. The electronic apparatus according to claim 9 further comprising at least a printed circuit board disposed in said main body and having an opening, wherein the centroids of said opening and said airflow channel are positioned at the same axis vertical to said top surface and said bottom surface.

11. The electronic apparatus according to claim 10 wherein said electronic apparatus has plural said airflow channels, and said printed circuit board has plural said openings correspondingly.

12. The electronic apparatus according to claim 9 wherein said curve structure has a specific height varying with the size of said electronic apparatus, and said specific height is at least 3 mm.

13. The electronic apparatus according to claim 9 wherein said electronic apparatus is a power adapter or a power supply.

14. The electronic apparatus according to claim 9 wherein the distances from said airflow channel to the edges of said main body are substantially equal.

15. The electronic apparatus according to claim 9 wherein said airflow channel has an opening at one side of said main body.

16. The electronic apparatus according to claim 9 wherein said main body and said airflow channel are integrally formed.

17. The electronic apparatus according to claim 9 further comprising a supporting device disposed on said bottom surface of said main body.

18. An electronic apparatus with natural convection structure, comprising:
   a main body to be placed on a surface, said main body having a top surface and a bottom surface and having an airflow channel formed by an inner wall extending from an exterior of said top surface to an opposite exterior of said bottom surface, wherein said bottom surface has a curve structure;

at least a printed circuit board disposed in said main body, said printed circuit board having an opening, and centroids of said opening and said airflow channel being positioned at a same axis substantially vertical to said top surface and said bottom surface; and a support device disposed on said bottom surface of said main body.

19. The electronic apparatus according to claim 18 wherein said curve structure combined with said supporting device has a specific height varying with the size of said electronic apparatus, and said specific height is at least 3 mm.

* * * * *